United States Patent [19]

Hu et al.

[11] Patent Number: 5,448,513
[45] Date of Patent: Sep. 5, 1995

[54] CAPACITORLESS DRAM DEVICE ON SILICON-ON-INSULATOR SUBSTRATE

[75] Inventors: Chenming Hu, Alamo; Hsing-Jen Wann, Albany, both of Calif.

[73] Assignee: Regents of The University of California, Oakland, Calif.

[21] Appl. No.: 161,734

[22] Filed: Dec. 2, 1993

[51] Int. Cl.⁶ ............................................. G11C 7/00
[52] U.S. Cl. ................................. 365/150; 365/182; 257/335; 257/345; 257/347
[58] Field of Search ................. 365/150, 182; 257/335, 257/345, 347

[56] References Cited

U.S. PATENT DOCUMENTS

| | | | |
|---|---|---|---|
| 4,090,254 | 5/1978 | Ho et al. | 365/150 |
| 4,298,962 | 11/1981 | Hamano et al. | 365/182 |
| 4,395,723 | 7/1983 | Harari | 357/23 |
| 4,706,107 | 11/1987 | Terada et al. | 357/23.5 |
| 4,725,875 | 2/1988 | Hsueh | 357/42 |
| 5,001,528 | 3/1991 | Bahraman | 357/23.7 |
| 5,055,890 | 10/1991 | Dawson et al. | 357/16 |
| 5,060,035 | 10/1991 | Nishimura et al. | 357/23.7 |
| 5,060,194 | 10/1991 | Sakui et al. | 365/177 |
| 5,122,986 | 6/1992 | Lim | 365/150 X |
| 5,164,805 | 11/1992 | Lee | 257/351 |
| 5,250,828 | 10/1993 | Honma | 257/296 |

*Primary Examiner*—Do Hyun Yoo
*Attorney, Agent, or Firm*—Townsend and Townsend and Crew

[57] ABSTRACT

A DRAM device has a first semiconductor region of one conductivity on the silicon film of a silicon-on-insulator substrate. A second and a third semiconductor region of the opposite conductivity type are formed in the first semiconductor region. A fourth semiconductor region of the same conductivity type as the first semiconductor region is formed within the second semiconductor region with higher doping concentration. An insulating layer is formed on the semiconductor surface. On top of the insulating layer, a gate electrode is formed and is at least partially overlapped with the first, the second, the third, and the fourth semiconductor region. A storage node is formed in the first semiconductor region between the second and the third semiconductor region where the information is stored. The amount of charge stored in the storage node is controlled by a first transistor including the fourth semiconductor region, the second semiconductor region, the storage node, and the gate electrode. The charge stored in the storage node will affect the characteristics of a second transistor including the third semiconductor region, the storage node, the second semiconductor region, and the gate electrode, thereby the information stored in the storage node is detected.

10 Claims, 9 Drawing Sheets

CAPACITORLESS DRAM DEVICE ON SILICON-ON-INSULATOR SUBSTRATE

BACKGROUND OF THE INVENTION

This invention relates generally to semiconductor devices, and more particularly the invention relates to dynamic random access memories (DRAM) and cell structures.

Dynamic random access memory (DRAM) is a major semiconductor product and has been the "technology driver" for the semiconductor industry. The commercial success of DRAM results from the smallness of the memory cell unit, which makes high storage density and low cost possible. DRAM cell contains one transistor for controlling READ/WRITE operations and one capacitor for charge storage. The transistor uses the smallest feature size transistor available thus drives the front-end technology such as lithography, transistor scaling and isolation. The technology developed for DRAM can later be used for fabricating other semiconductor products.

However the challenge of DRAM technology of 64 megabits and beyond has been more on how to build a large capacitor in a small area rather than on transistor scaling. The storage capacitor needs about 30 fF to provide enough signal-to-noise ratio. Novel dielectric-constant material or novel memory cell structure become the main focuses for current DRAM technology. Besides the fact that the fabrication process of 64 megabits DRAM and beyond is becoming more and more difficult, the development and manufacturing cost is increasing tremendously yet the technology developed for DRAM is not extendible to other semiconductor products. The limit of $C_s=30$ fF is not likely to be lessened if the principles of the cell operation, the charge-sharing between the storage capacitor and the READ (bit line) capacitor (i.e., the single-event upset READ scheme), remain unchanged, and will only become more stringent for gigabits DRAM technology.

The concept of "gain cell" has been proposed to alleviate the dependence on large cell capacitance. Many gain cells proposed use an additional transistor (e.g., JFET Complementary MOS, or BJT) to amplify the charge stored in a smaller capacitor whose size is lowerbounded by soft-error consideration ($\sim 10$ fF). However these gain cells either take larger cell layout area or involve complicated fabrication process, both of which increase development and manufacturing costs. Another category of gain cells use the concept of "dynamic threshold." These gain cells do not need large storage capacitors, however, gain cells based on the dynamic threshold operation are sensitive to the processing condition and maybe difficult to manufacture.

SUMMARY OF THE INVENTION

This invention provides a capacitorless DRAM device on silicon-on-insulator substrate with large read current, good immunity to α-particle-induced single-even-upset, and simple fabrication process. The size of the capacitorless DRAM device is that of a single transistor, which makes it very attractive for ultra high density memory applications. Using SOI substrate not only avoids many problems that make prior art devices impossible or impractical but also greatly simplifies the fabrication process. Since the capacitorless DRAM device employs the operation concept similar to dynamic threshold devices, the large capacitor is not needed. In the capacitorless DRAM the charge is stored in the front surface of the thin silicon film of silicon-on-insulator substrate. The stored charge modulate the function of the read transistor (e.g. the threshold voltage of a MOSFET). The amount of charge read in the capacitorless DRAM cell can easily exceed the amount of charge read in ordinary DRAM cell ($\sim 100$ fC).

DETAILED DESCRIPTION OF THE ILLUSTRATIVE EMBODIMENT

Figure 1A:
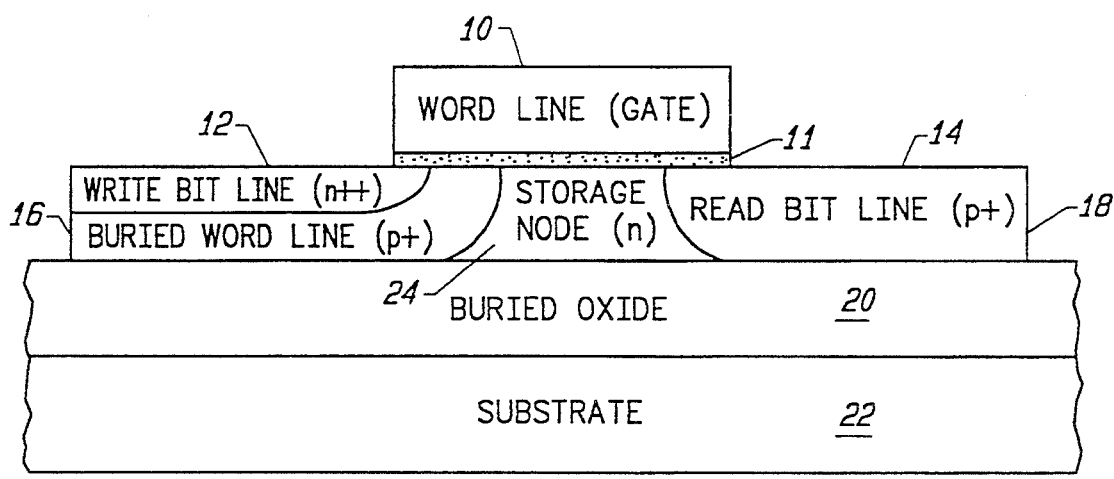
FIG. 1A is a cross section view of a capacitorless DRAM cell in accordance with one embodiment of the invention.
Figure 1B:
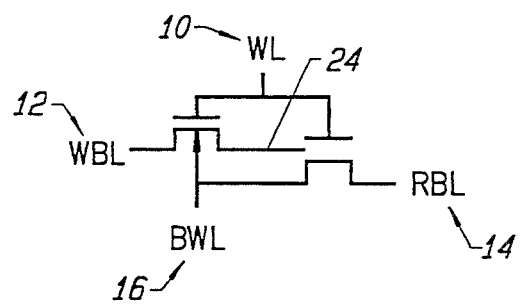
FIG. 1B is a schematic diagram of the DRAM cell.

In FIG. 1A the cross-sectional view of the capacitorless DRAM device formed in a silicon-on-insulator structure, it has a word line (WL) formed by the gate 10 formed on gate insulator 11, an N++ write bit line (WBL) 12, a P+ read bit line (RBL) 14, and a P+ buried word line (BWL) 16. The device is formed in a semiconductor layer 18 on a first oxide insulating layer 20 which insulates the device from the supporting substrate 22 and from adjacent devices. The substrate and oxide insulating layer can be integral as in conventional silicon-on-insulator substrate. The substrate and insulating layer can be silicon and silicon oxide respectively. This device can also be realized by using the opposite conductivity type semiconductor in each region of FIG. 1. The write transistor is composed of the WBL, BWL, the floating body, and the gate. The read transistor is composed of the RBL, the floating body, storage node 24 the BWL, and the gate (FIG. 1B). They are integrated together within one compact structure. Compared to ordinary DRAM cells, the fabrication process is simpler. Though the cross sectional view of the present invention looks similar to the device taught in U.S. Pat. No. 4,395,723, they are different in important ways. In the present invention, node BWL that resembles the floating storage nodes 102 in FIG. 1A, 202 in FIG. 2A, 302 in FIG. 3A and 402 in FIG. 4A of U.S. Pat. No. 4,395,723 is not the storage node. It is electrically connected to the peripheral circuit. In the present invention the storage node is the floating body that resembles nodes 104 in FIG. 1A, 204 in FIG. 2A, 304 in FIG. 3A, and 404 in FIG. 4A, which in U.S. Pat. No. 4,395,723 are biased at ground or $V_{CC}$. For the device taught in U.S. Pat. No. 4,395,723 the storage node is built on the substrate a region of the opposite conductivity type semiconductor. Therefore the substrate needs low doping concentration which results in high resistivity (104 in FIG. 1A, 204 in FIG. 2A, 304 in FIG. 3A, and 404 in FIG. 4A in U.S. Pat. No. 4,395,723), and the storage node needs high doping concentration which results in high junction capacitance ($C_1$ in FIG. 1A and similarly in FIGS. 2A, 3A, and 4A in U.S. Pat. No. 4,395,723). These are significant shortcomings which make the device taught in U.S. Pat. No. 4,395,723 impractical. The transistors that provide the read current (e.g. 120 to 106 in FIG. 1A, 220 to 206 in FIG. 2A, 320 to 306 in FIG. 3A, and 420 to 406 in FIG. 4A in U.S. Pat. No. 4,395,723) are vertical transistors (the source is situated below the drain) requiting the current to flow through the lightly doped, high-resistivity, region. This added resistance significantly reduces the available current in comparison with the conventional lateral transistors. In addition, the bit line of the memory (120 in FIG. 1A, 220 in FIG. 2A, 320 in FIG. 3A, and 420 in FIG. 4A in U.S. Pat. No. 4,395,723) has large junction capacitance ($C_1$ in FIG. 1A and similarly in FIGS. 2A, 3A, and 4A in U.S. Pat. No. 4,395,723) which further reduces the speed performance. A third shortcoming is the difficulty of routing the required negative voltages (Table 1 in U.S. Pat. No. 4,395,723). Without silicon-on-insulator this would imply the use of a triple-well technology to isolate the devices carrying the negative voltage, resulting in more complex circuit design, larger chip size, lower performance, and higher cost. Finally $\alpha$-particle induce single-event-upset is a problem because of the large storage node junction.

In the present invention the storage region is not formed on the substrate, but is the starting material itself. The present invention solves all these problems through the use of silicon-on-insulator substrate. On a silicon-on-insulator substrate the devices carry negative voltages can be isolated (by oxide, not by pn junctions) from those carrying positive voltages without special precautions. The immunity to $\alpha$-particle-induced single-event-upset is improved because the junction area is reduced and the path from the charge generated by the $\alpha$-particle to the storage node is cut off. Furthermore, normal lateral transistors with low resistivity source and drain are used for read and write, the magnitude of the read current will not be degraded. Also the read bit line capacitance is smaller because it is connected to the junction capacitance on the lightly-doped substrate (between RBL and the floating body). Large read current and small bit line capacitance are important factors in determining DRAM performance.

In the first embodiment, the memory device is operated according to Table 1:

TABLE 1

An example of the operating voltages of the capacitorless DRAM device of accumulation mode.

| Operation | WL | WBL | RBL | BWL | SUB |
|---|---|---|---|---|---|
| Purge | 0 | 0.6 | 0 | GROUND | GROUND |
| Read | 0.6 | | 0.6 | | |
| Hold | 1.8 | | | | |
| Write "1" | 3 | | | | |
| Write "0" | | 1.8 | | | |

Figure 2:
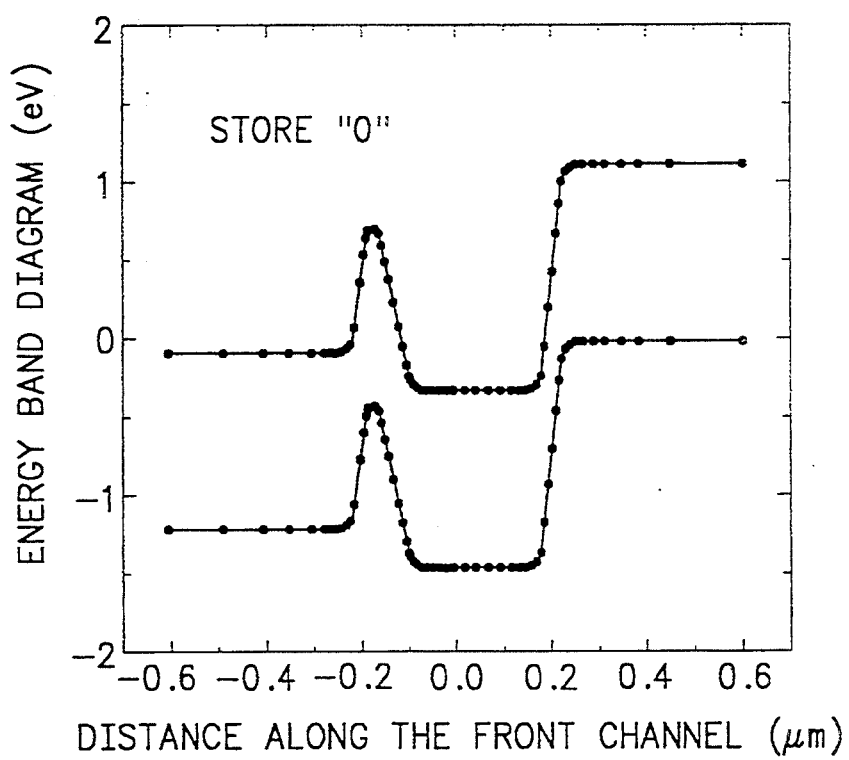
FIG. 2 is an energy band diagram of the DRAM cell in a "0" storage state.
Figure 3:
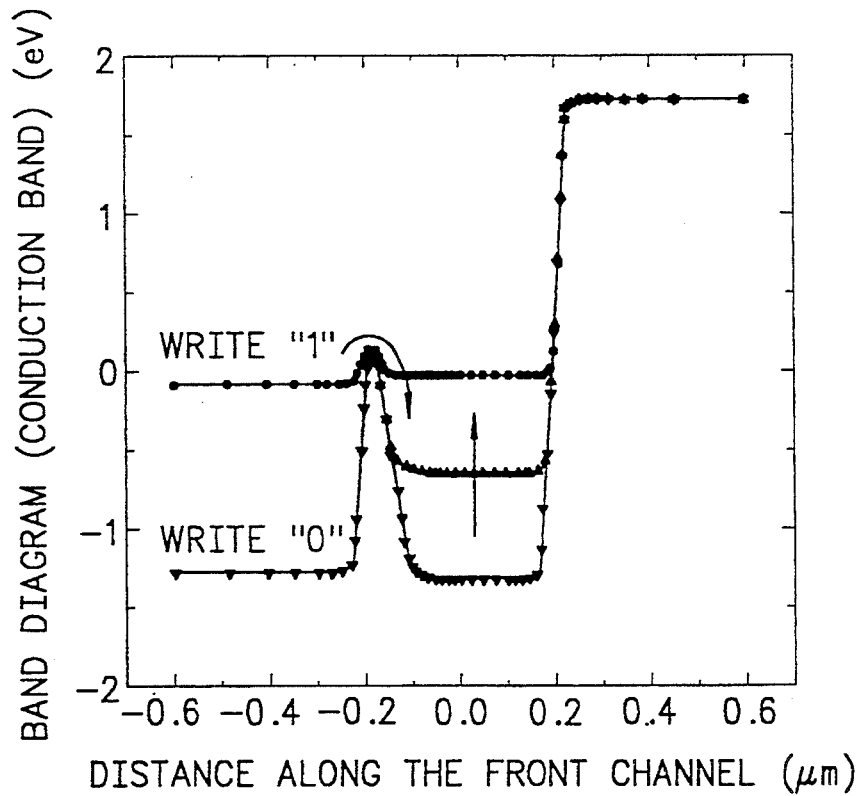
FIG. 3 is an energy band diagram of the DRAM cell during a write operation.
Figure 4:
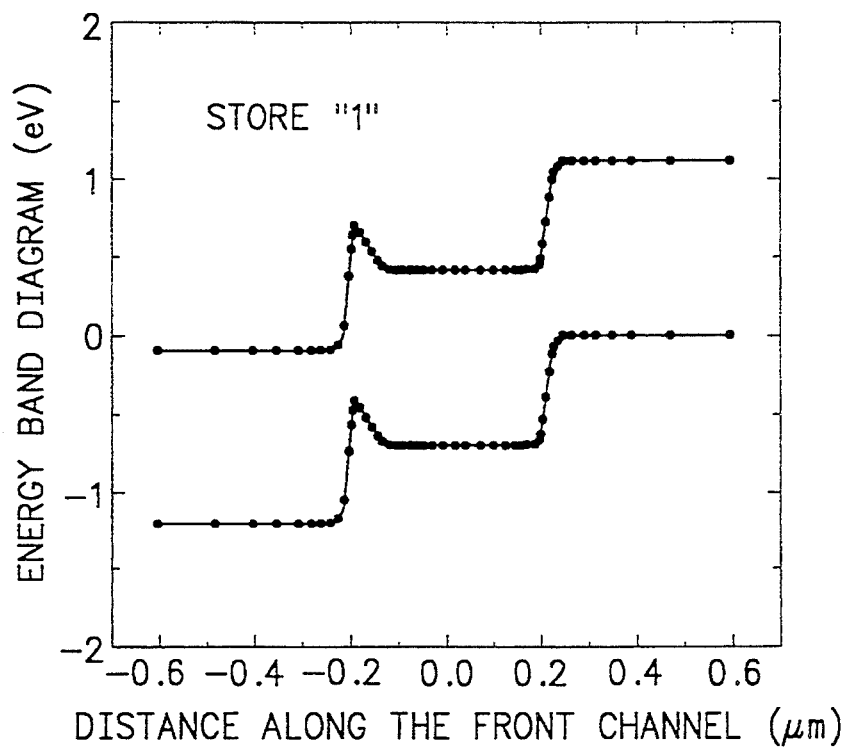
FIG. 4 is an energy band diagram of the DRAM cell with a "1" stored therein.

The memory states "0" and "1" are distinguished by the amount of majority carriers injected from WBL into the storage node (accumulation mode operation), which is fundamentally different from the device proposed in U.S. Pat. No. 4,395,723 in which the memory states of "0" and "1" are distinguished by the depletion of majority carrier out of the storage node (depletion mode operation). In this embodiment, when the capacitorless DRAM device is not performing read and write, i.e., in the holding state, the biasing voltages are: WL 1.8 V, RBL and WBL 0.6 V, and BWL 0 V. The positive WL voltage tends to accumulate the floating body. Since there is no electron supply to form the accumulation layer, a potential well is formed in the floating body (FIG. 2). In writing the capacitorless DRAM cell, WL voltage increases to 3 V. WBL is biased at 0.6 V for writing a "1" and at 1.8 V (larger than 1.2 V will be enough) for writing a "0." With WL voltage at 3 V and WBL voltage at 0.6 V for writing a "1", the write NMOSFET is turned and electrons inject from WBL into the storage node to supply the accumulation layer at the front surface of the floating body until the potential well is "filled," that is, fermi levels of the WBL and of the front surface of the floating body are aligned (FIG. 3). The write time takes less than a few nano seconds. For writing a "0" WBL is biased at 1.8 V, electrons will be blocked by the barrier and the potential well remains empty (FIG. 3). After writing the capacitorless DRAM device, WL returns to the holding voltage 1.8 V (FIGS. 2 and 4).

The write mechanism of the capacitorless DRAM device is not limited to the MOSFET operation as described in the example. Punchthrough and tunneling are also possible mechanisms that can be used for the write operation. For some capacitorless DRAM device array layout BWL voltages can also be used for write operations if BWLs are not common to the whole array but are laid out along the WL directions. In fact it is advantageous of using both WL and BWL for the write operation because less WL voltage such as 2.5 V is needed if BWL is biased at to 0.6 V during write.

Figure 5:
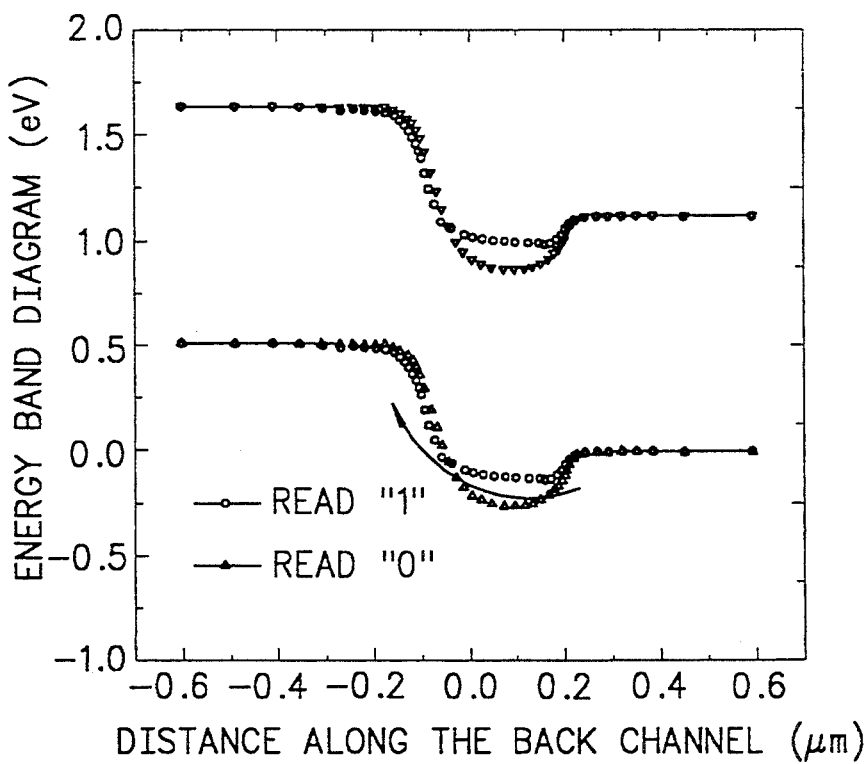
FIG. 5 is an energy band diagram of the DRAM cell during a read operation.

For the read operation, WL is biased to 0.6 V. The potential of the storage node is capacitively coupled to the WL voltage thus the hole barrier is reduced. If the capacitorless DRAM device is in state "1" with electrons in the front surface accumulation layer of the storage node, the read transistor will turn on when WL is 0.6 V and a large hole current will flow from RBL to BWL to generate a signal to be detected at RBL. If the capacitorless DRAM device is in state "0" with no electron in the front channel of the floating body, the read transistor will not turn on when WL is 0.6 V and there is no current flow from RBL to BL (FIG. 5). The operation of the read transistor can function either like a MOSFET or a BJT, depending on the device design. For example, when WL is biased at the read voltage, if the voltage coupling from WL to the floating body is strong such as in the case that the film is fully-depleted and that the band-bending of the floating body is large, the read transistor behaves more like an MOSFET and the read operation is non-destructive because the potential barrier for electrons residing in the front surface accumulation layer remains high even the hole barrier at the back surface is low. If the voltage coupling from WL to the floating body is weak as in the case the film is non-fully-depleted that the band-bending of the silicon film is small, part of the floating body will be quasi-neutral and the read transistor behaves like a BJT. The read operation is destructive because the electron barrier in the front surface accumulation layer is low when the hole barrier is low. In this case the holes are not necessarily flowing through the back surface of the silicon-on-insulator film from RBL to BWL.

Figure 6:
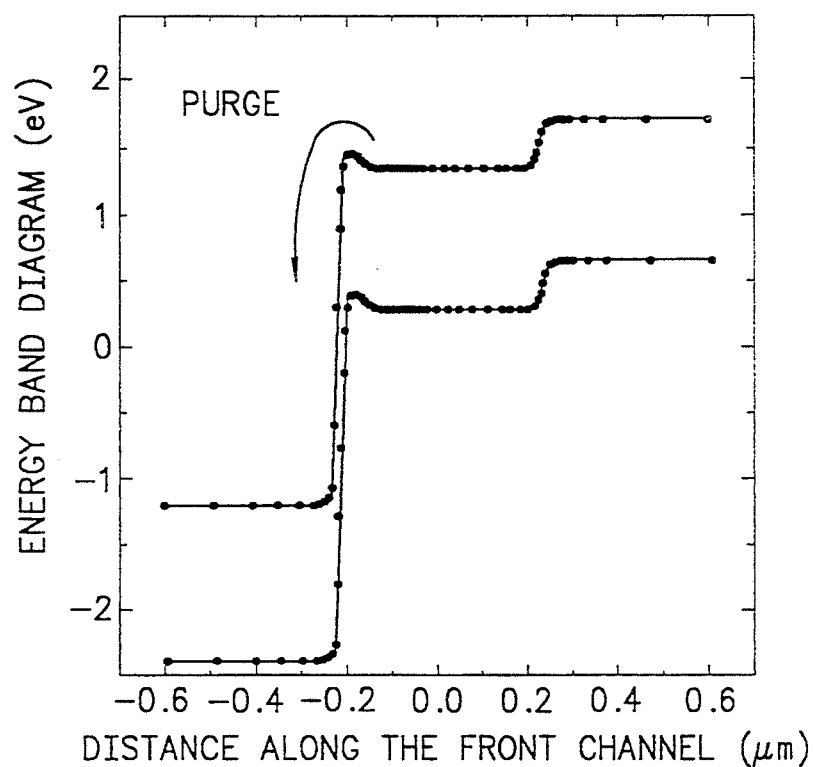
FIG. 6 is an energy band diagram where the DRAM cell is purged.
Figure 7:
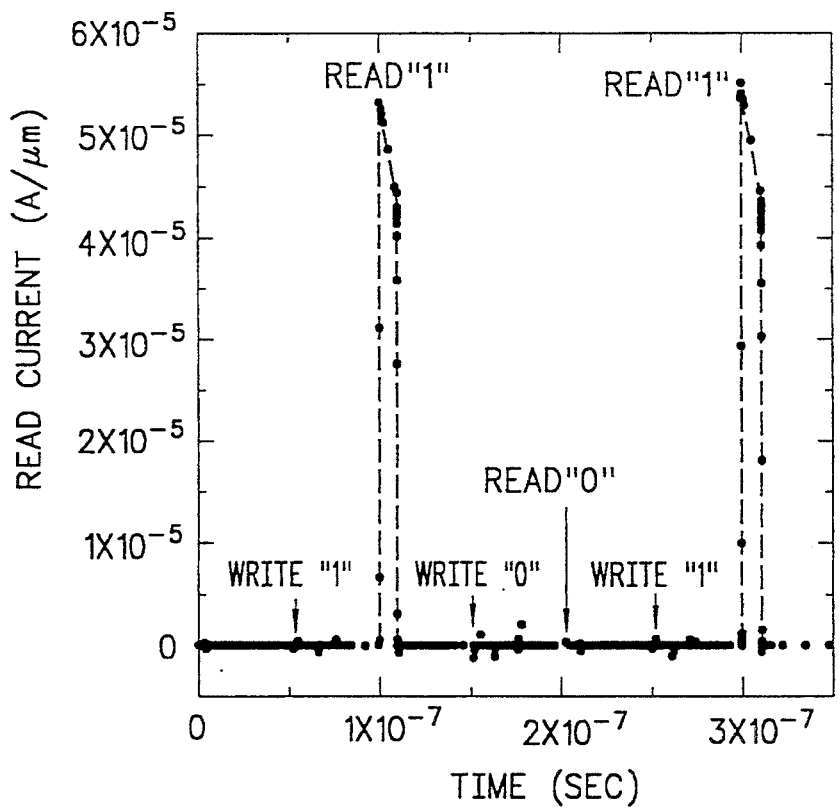
FIG. 7 illustrates transient RBL current of the DRAM cell during read/write cycles.
Figure 8:
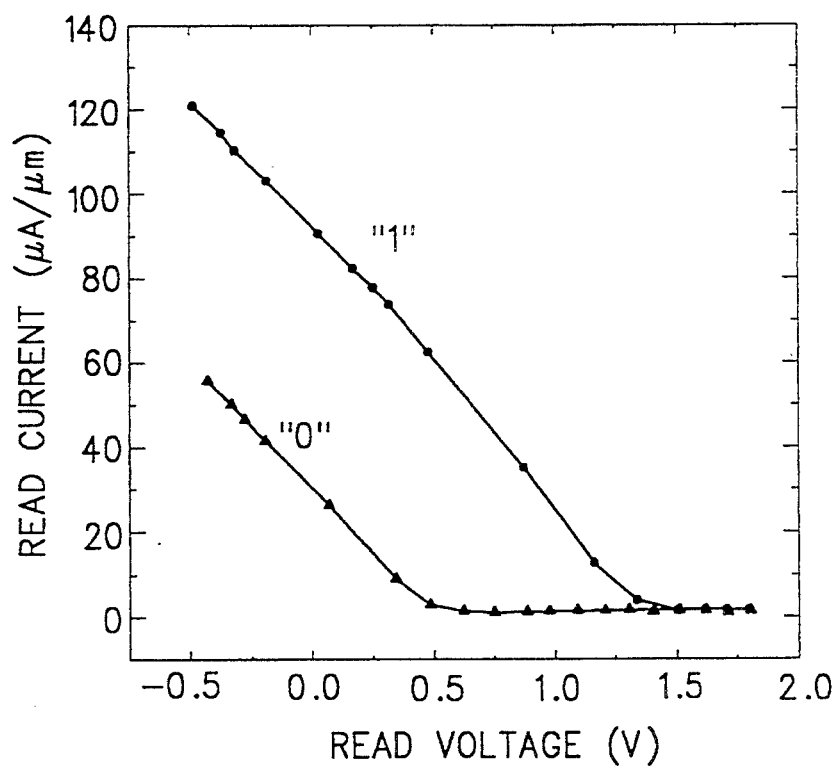
FIG. 8 illustrates read (RBL) current as a function of read (WL) voltage with and without stored electrons.

In this embodiment, the capacitorless DRAM device has to be in state "0" before it can be written again. One way to achieve this is to employ destructive read, then the capacitorless DRAM device is ready for writing after read. If the read operation is non-destructive, an optional purge operation can be employed. Purge can be done by applying 0 or negative voltage to WL to expel the electrons out of the potential well. Increasing BL voltage can also help the efficiency of purging the cell and avoid heavy turn-on of the read transistor (FIG. 6). The memory operation of the capacitorless DRAM device in the first embodiment is demonstrated in FIGS. 7 and 8 by the numerical simulations.

In the second embodiment, the capacitorless DRAM cell can be operated in the depletion mode according to Table 2:

TABLE 2

An example of the operating voltages of the capacitorless DRAM device of depletion mode.

| Operation | Node | | | | |
|---|---|---|---|---|---|
|  | WL | WBL | RBL | BWL | SUB |
| Read | −1.5 | 0 | −1 | GROUND | GROUND |
| Hold | 0 | | | | |
| Write "1" | 3 | | | | |
| Write "0" | | 2 | | | |

For this embodiment the mode of operation is similar to the prior art device in U.S. Pat. No. 4,395,723 but the storage node is different. In the holding state WL is biased at 0 V. In writing "0" WBL is biased at 2 V and WL is biased at 3 V to turn on the write NMOSFET so that the floating body is charged to 2 V to increase the threshold voltage of the read PMOSFET. In writing a "1" WBL is biased at 0 V and WL is biased at 1.5 V so that the floating body is charged to 0 V. For reading, WL is biased at −3 V and RBL is biased at −1 V. The "0" and "1" states are thus distinguished with different threshold voltage of the read transistor. The read operation is non-destructive. This embodiment requires the voltage coupling from WL to BWL to be stronger than the voltage coupling from WL to the floating body. However BWL usually has a higher doping concentration therefore a weaker voltage coupling from WL. One way to increase voltage coupling from WL to BWL is to use thinner oxide in the region between WL and BWL.

Figure 9:
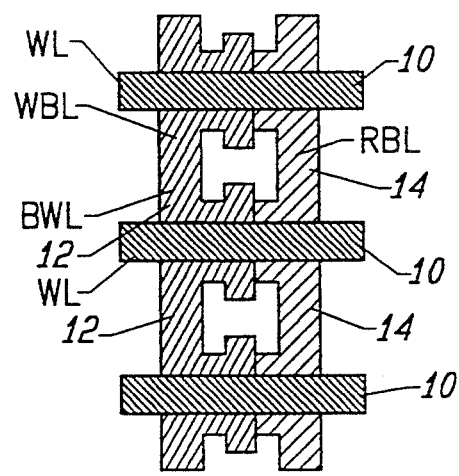
FIG. 9 is a plan view of an array of DRAM cells in accordance with art embodiment of the invention.
Figure 10:
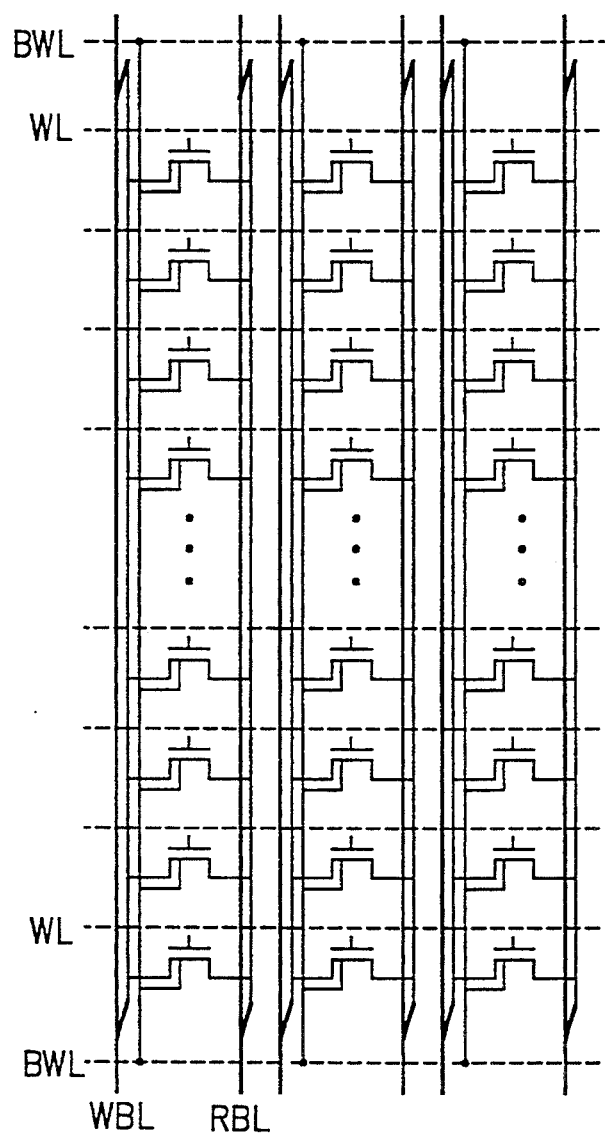
FIG. 10 is a schematic diagram of the array of DRAM cells of FIG. 9.
Figure 11:
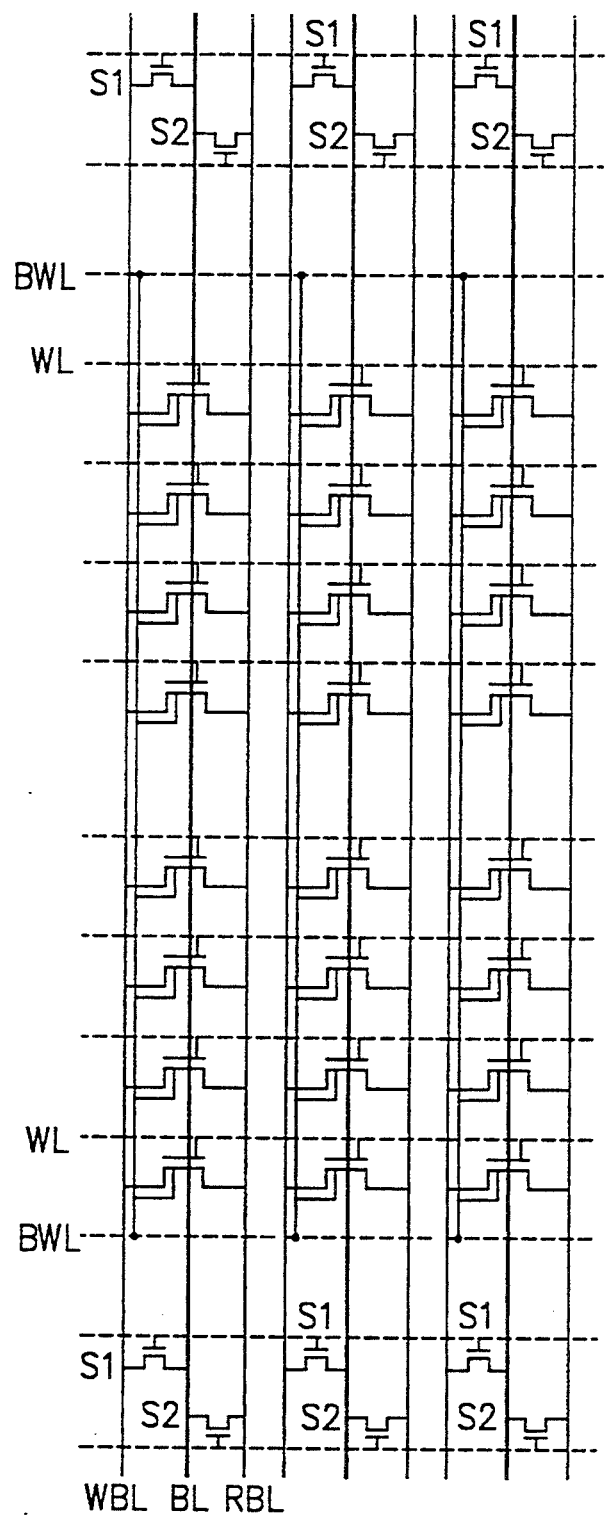
FIG. 11 is a schematic diagram of an alternative embodiment of the array of DRAM cells of FIG. 9.

In the embodiment of the memory array architecture, the capacitorless DRAM device described above can be put into a two-dimensional contactless array shown in FIG. 9. The schematic diagram is shown in FIG. 10. If BWLs are grounded at all times they can be contacted through metal or polysilicide interconnect parallel to WL once every several rows. To fully explore the high speed performance of the capacitorless DRAM devices, using two metal lines per memory array column (one for RBL and one for WBL) is desirable so that the RBL has low capacitance. In considering the memory density however it is desirable to use one metal line per column. Since the read and write operations of the capacitorless DRAM device are quite independent, that is, during the read operation, WBL can be a high impedance node, and vise versa. The concept of "alternative metal scheme" can possibly be employed by sharing RBL and WBL with one metal with switching transistors to achieve one metal line per bit. For example, before the write cycle starts, BWL is charged to 0 V through select transistor $S_2$ and the metal line. Then $S_2$ is turned off and $S_1$ is turned on so that metal line is connected to WBL to perform write. The read cycle can be done similarly.

Figure 12:
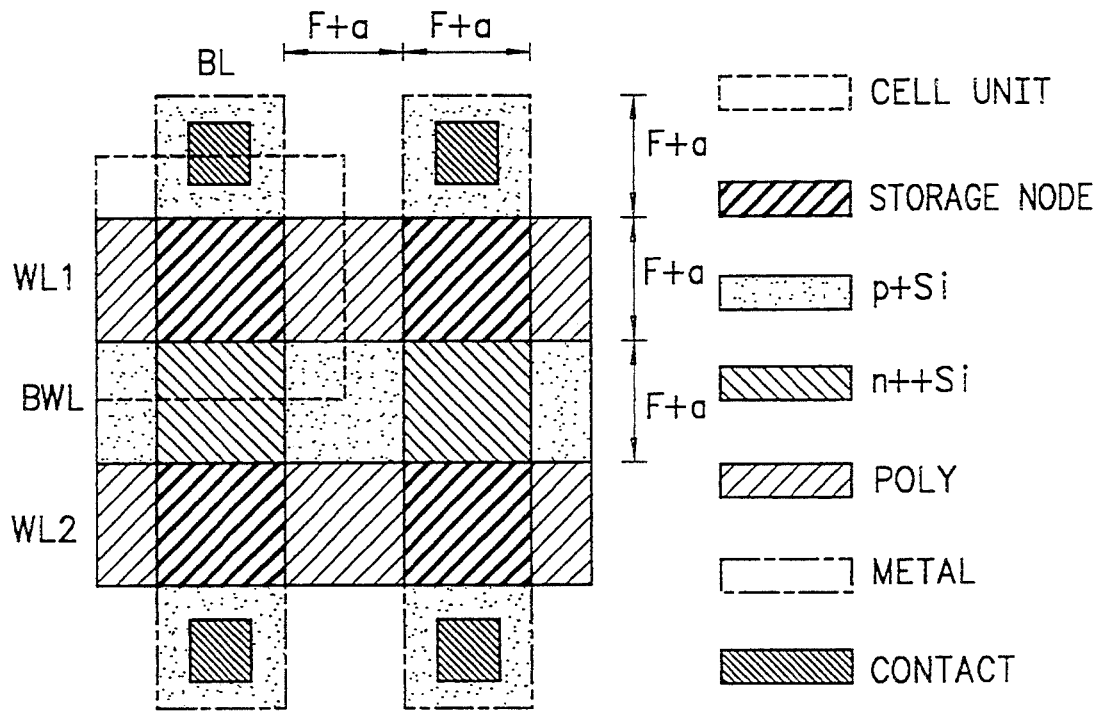
FIG. 12 is a plan view of an array of DRAM cells in accordance with another embodiment of the invention.
Figure 13:
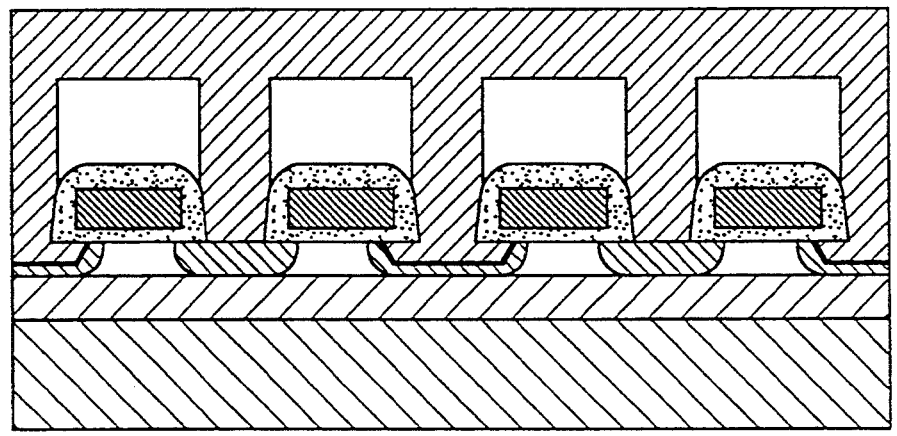
FIG. 13 is a cross section view of the DRAM device array of FIG. 12 taken along a bit line, BL.
Figure 14:
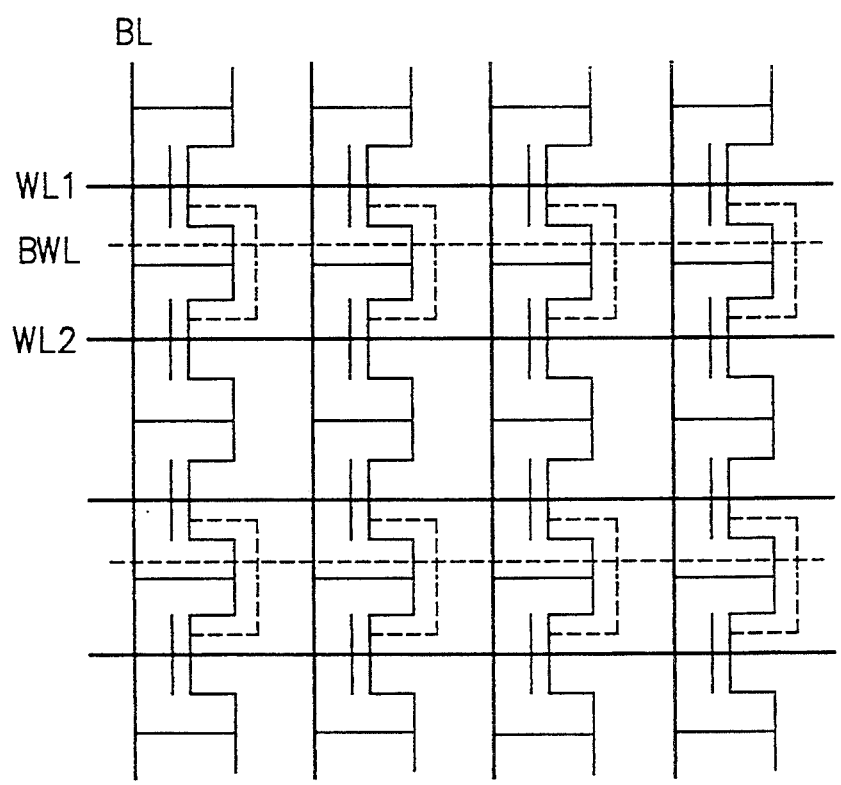
FIG. 14 is a schematic diagram of the DRAM device array of FIG. 12.

An another embodiment which focuses on improving the array density of the capacitorless DRAM device is to use one metal bit line for both Pd3L and WBL. In this way the memory cell size can be reduced to $4(F+a)^2$, where F is the minimum feature size and a is the alignment tolerance. For example, FIGS. 12, 13, and 14 are the array layout, the array cross section along BLs, and the array schematic diagram. The operating voltages of this embodiment is listed in Table 3:

TABLE 3

Operating voltages for the capacitorless DRAM device with $4(F + a)^2$ unit cell size.

| Functions | WL1 (selected) | BWL | W/BL's RBL & WBL | WL2 | Other WL's |
|---|---|---|---|---|---|
| HOLD | 3 | −1.5 | 0 | 1.5 | 3 |
| READ "1" | 0 | −1.5 | <0 | | |
| READ "0" | | | 0 | | |
| PURGE | −1.5 | 0 | ~0 | | |
| WRITE "1" | 3 | 0 | 0 | | |
| WRITE "0" | | | 0.6 | | |

Since two neighboring WLs (WL1 and WL2 in FIGS. 12 and 14) are sharing with one BWL, when WL1 in FIG. 12 is selected, WL2 has to be biased at 1.5 V to avoid data disturbance. The price paid for using one bit line for both RBL and WBL is that the read and write operations can not be optimized separately, and the bit line voltage swing is limited to about 0.6 V to avoid disturbing the data in memory devices in unselected rows.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A capacitorless dynamic memory cell comprising a body including a support substrate, a first dielectric insulating layer on said substrate, and a semiconductor layer on said first dielectric insulating layer, said semiconductor layer having a surface, a storage node in said semiconductor layer abutting said surface, and electrically isolated from said substrate by said first dielectric insulating layer, said storage node having a net dopant concentration of a first conductivity type, a write bit line region abutting said surface and spaced from said storage node, said write bit line region having a net dopant concentration of said first conductivity type, a buried word line region abutting said surface and positioned between and abutting said storage node and said write bit line region, said buried word line region having a net dopant concentration of a second conductivity type, a read bit line region abutting said surface and said storage node opposite from said buried word line region, said read bit line region having a net dopant concentration of said second conductivity type, a second dielectric insulating layer on said surface, and a gate electrode on said second dielectric insulating layer positioned over said storage node and said buried word line region, said gate electrode functioning with said write bit line region, said buried word line region, and said storage node as a write transistor, and said gate electrode functioning with said buried word line region, said storage node, and said read bit line region as a read transistor.

2. The memory cell as defined by claim 1 wherein said first conductivity type is n-type and said second conductivity type is p-type.

3. The memory cell as defined by claim 2 wherein electrons from said buried word line region flow into said storage node in writing into said cell and increasing conductance of said read transistor.

4. The memory cell as defined by claim 2 wherein said storage node is charged with a positive voltage from said write bit line region in writing into said cell and increasing threshold voltage of said read transistor.

5. The memory cell as defined by claim 4 wherein said body comprises a silicon substrate with said first insulating layer comprising silicon oxide and said semiconductor layer comprising silicon.

6. The memory cell as defined by claim 1 wherein said body comprises a silicon substrate with said first insulating layer comprising silicon oxide and said semiconductor layer comprising silicon.

7. A dynamic random access memory comprising an array of memory cells arranged in rows and columns, each memory cell comprising a body including a supporting substrate, a first dielectric insulating layer on said substrate, and a semiconductor layer on said first dielectric insulating layer, said semiconductor layer having a surface, a storage node in said semiconductor layer abutting said surface and electrically isolated from said substrate by said first dielectric insulating layer, said storage node having a net dopant concentration of a first conductivity type, a write bit line region abutting said surface and spaced from said storage node, said write bit line region having a net dopant concentration of said first conductivity type, a buried word line region abutting said surface and positioned between and abutting said storage node and said write bit line region, said buried word line region having a net dopant concentration of a second conductivity type, a read bit line region abutting said surface and said storage node opposite from said buried word line region, said read bit line region having a net dopant concentration of said second conductivity type, a second dielectric insulating layer on said surface, and a gate electrode on said second dielectric insulating layer positioned over said storage node and said buried word line region, said gate electrode functioning with said write bit line region, said buried word line region, and said storage node as a write transistor, and said gate electrode functioning with said buried word line region, said storage node, and said read bit line region as a read transistor, wherein said body of each memory cell comprises a portion of a common substrate.

8. The dynamic random access memory as defined by claim 7 and including a conductive word line interconnecting all gate electrodes of cells along a row, and at least one conductive bit line interconnected to cells along a column.

9. The dynamic random access memory as defined by claim 8 and including switch means for selectively connecting said at least one conductive bit line to all write bit line regions in said column and to all read bit line regions in said column.

10. The dynamic random access memory as defined by claim 8 and including a write bit line connected to all write bit line regions in said column and a read bit line connected to all read bit line regions in said column.

* * * * *